(12) United States Patent
Jung et al.

(10) Patent No.: US 12,589,568 B2
(45) Date of Patent: Mar. 31, 2026

(54) METHOD FOR PRODUCING INJECTION-MOLDED ARTICLE AND ELECTRONIC DEVICE COMPRISING INJECTION-MOLDED ARTICLE

(71) Applicant: Samsung Electronics Co., Ltd., Suwon-si (KR)

(72) Inventors: Chunghyo Jung, Suwon-si (KR); Seonmi Park, Suwon-si (KR); Hyein Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 224 days.

(21) Appl. No.: 18/465,525

(22) Filed: Sep. 12, 2023

(65) Prior Publication Data

US 2023/0415439 A1 Dec. 28, 2023

Related U.S. Application Data

(63) Continuation of application No. PCT/KR2022/005018, filed on Apr. 7, 2022.

(30) Foreign Application Priority Data

Apr. 12, 2021 (KR) ........................ 10-2021-0046987

(51) Int. Cl.
*B29D 99/00* (2010.01)
*G06F 1/16* (2006.01)
(Continued)

(52) U.S. Cl.
CPC ......... *B29D 99/006* (2013.01); *G06F 1/1626* (2013.01); *H01Q 1/243* (2013.01);
(Continued)

(58) Field of Classification Search
CPC ................ B23K 26/362; B29D 99/006; B29C 2045/0058; B29C 2045/0079;
(Continued)

(56) References Cited

U.S. PATENT DOCUMENTS 5,747,769 A 5/1998 Rockstroh et al.
10,852,222 B2 * 12/2020 Yamaguchi .......... G01M 11/088
(Continued)

FOREIGN PATENT DOCUMENTS

KR 100882114 B1 2/2009
KR 20110088685 A 8/2011
(Continued)

OTHER PUBLICATIONS

International Search Report for PCT/KR2022/005018 mailed Jul. 19, 2022, 4 pages.
(Continued)

*Primary Examiner* — Thien M Le
(74) *Attorney, Agent, or Firm* — Nixon & Vanderhye P.C.

(57) ABSTRACT

A method for producing an injection-molded article, according to various embodiments, comprises: molding an injection-molded article; irradiating, in a primary irradiation operation, a laser on primary irradiation regions spaced from each other, on at least a portion of the surface of the injection-molded article; irradiating, in a secondary irradiation operation, a laser on secondary irradiation regions spaced from each other, on at least a portion of the surface of the injection-molded article; and, on the surface of the injection-molded article, forming a plating layer on the primary irradiation regions and the secondary irradiation regions, wherein each of the secondary irradiation regions may at least partially overlap with at least one of the primary irradiation regions.

15 Claims, 9 Drawing Sheets

(51) Int. Cl.
 *H01Q 1/24* (2006.01)
 *H01Q 1/38* (2006.01)
 *H04M 1/02* (2006.01)
 *H05K 5/02* (2006.01)
(52) U.S. Cl.
 CPC ............ *H01Q 1/38* (2013.01); *H04M 1/0277* (2013.01); *H05K 5/02* (2013.01)
(58) Field of Classification Search
 CPC ............ B29C 45/0053; B29L 2031/34; B29L 2031/3425; B29L 2031/3456; C23C 14/00; C23C 14/06; G06F 1/1626; G06Q 50/04; H01Q 1/243; H01Q 1/38; H04M 1/0277; H04M 1/0283; H05K 5/02
 See application file for complete search history.

(56) References Cited

U.S. PATENT DOCUMENTS

| | | | | |
|---|---|---|---|---|
| 11,220,454 | B2 * | 1/2022 | Jeong | G02B 1/10 |
| 2009/0053439 | A1 | 2/2009 | Sung et al. | |
| 2010/0215404 | A1 * | 8/2010 | Okamoto | H04N 1/02865 |
| | | | | 399/221 |
| 2012/0095124 | A1 * | 4/2012 | Kirino | C07C 243/40 |
| | | | | 528/109 |
| 2012/0108013 | A1 * | 5/2012 | Fujisawa | H01L 21/268 |
| | | | | 257/E21.504 |
| 2014/0374609 | A1 * | 12/2014 | Iwasaki | H10F 77/12 |
| | | | | 438/73 |
| 2015/0299566 | A1 * | 10/2015 | Kinoshita | C09K 11/025 |
| | | | | 252/301.36 |
| 2020/0028243 | A1 | 1/2020 | Cho | |
| 2020/0103559 | A1 * | 4/2020 | Fujii | C03C 21/002 |
| 2020/0385307 | A1 | 12/2020 | Li et al. | |
| 2023/0106971 | A1 * | 4/2023 | Kitani | B29C 70/003 |
| | | | | 428/413 |
| 2023/0135856 | A1 * | 5/2023 | Darraillan | G08G 5/21 |
| | | | | 701/423 |
| 2023/0136856 | A1 * | 5/2023 | Hiroi | B65D 81/266 |
| | | | | 435/288.4 |

FOREIGN PATENT DOCUMENTS

| | | | |
|---|---|---|---|
| KR | 20120108752 | A | 10/2012 |
| KR | 20130138575 | A | 12/2013 |
| KR | 20140106862 | A | 9/2014 |
| KR | 101509473 | B1 | 4/2015 |
| KR | 101535655 | B1 | 7/2015 |
| KR | 101537739 | B1 | 7/2015 |
| KR | 101868827 | B1 | 6/2018 |
| KR | 20180106295 | A | 10/2018 |
| KR | 101968047 | B1 | 4/2019 |

OTHER PUBLICATIONS

Written Opinion of the ISA for PCT/KR2022/005018 mailed Jul. 19, 2022, 4 pages.

* cited by examiner

METHOD FOR PRODUCING INJECTION-MOLDED ARTICLE AND ELECTRONIC DEVICE COMPRISING INJECTION-MOLDED ARTICLE

CROSS-REFERENCE TO RELATED APPLICATIONS

This application is a continuation of International Application No. PCT/KR2022/005018 designating the United States, filed on Apr. 7, 2022, in the Korean Intellectual Property Receiving Office and claiming priority to Korean Patent Application No. 10-2021-0046987, filed on Apr. 12, 2021, in the Korean Intellectual Property Office, the disclosures of each of which are incorporated by reference herein in their entireties.

BACKGROUND

Field

The disclosure relates to an injection-molded article, and, for example, relate to a method for producing an injection-molded article and an electronic device including an injection-molded article produced using the method.

Description of Related Art

As electronic, information, and communication technologies develop, various functions are being integrated into one electronic device. For example, a smartphone includes functions such as a sound reproducing device, a photographing device, or an electronic notebook in addition to a communication function, and more diverse functions may be implemented in the smartphone via additional installation of an application. The electronic device may receive various pieces of information in real time by accessing a server or other electronic devices in a wired or wireless manner, as well as executing a loaded application or a stored file.

As the use of a personal portable electronic device such as a smartphone becomes common, user demands for portability and convenience of use are gradually increasing. Portability and convenience of use may be mutually exclusive. For example, in order to secure portability, an electronic device must be miniaturized and/or lightweight, but in a miniaturized and/or lightweight electronic device, the screen size or battery capacity may be limited, thereby deteriorating convenience of use. Recently, due to the commercialization of a flexible display which is capable of being folded or rolled, the appearance of an electronic device is gradually evolving from a simple bar shape to a foldable, slidable, or expandable shape, thereby improving portability and convenience of use.

As communication antennas according to various communication protocols are mounted in one electronic device, conditions for securing a stable wireless communication environment are gradually deteriorating. For example, when an arrangement environment sufficiently open to the outside is provided while excluding interference with other nearby structures or other antennas, the antenna(s) may stably transmit and receive radio signals. However, as the internal space of an electronic device gradually narrows due to miniaturization and light weight, there may be difficulties in designing and arranging antennas. In a miniaturized electronic device, it may be easy to implement an antenna by forming an electrically conductive pattern on an injection-molded article. However, it may be difficult to harmonize with the appearance of the electronic device while securing a sufficient thickness of the conductive pattern which functions as an antenna. For example, the conductive pattern may be disposed to face an external space while having a sufficient thickness to provide stable performance and power efficiency in wireless communication. In this case, the area where the conductive pattern is disposed forms a surface which protrudes more than other areas, and thus the appearance of the electronic device may be deteriorated.

SUMMARY

Embodiments of the disclosure may provide a method for producing an injection-molded article including a conductive pattern disposed on a surface facing an external space while the injection-molded article is not visually and/or tactilely exposed to the outside and an electronic device including the injection-molded article produced using the method.

Embodiments of the disclosure may provide an electronic device capable of performing stable wireless communication using a conductive pattern disposed while being sufficiently open to the outside.

According to various example embodiments disclosed herein, a method for producing an injection-molded article may include: molding an injection-molded article, irradiating a laser on areas spaced apart from each other (hereinafter, "primary irradiation areas"), on at least a part of the surface of the injection-molded article (hereinafter, "primary irradiation operation"), irradiating a laser on other areas spaced apart from each other (hereinafter, "secondary irradiation areas"), on at least a part of the surface of the injection-molded article (hereinafter, "secondary irradiation operation"), and forming a plating layer on the primary irradiation areas and the secondary irradiation areas, on the surface of the injection-molded article, wherein each of the secondary irradiation areas at least partially overlap at least one of the primary irradiation areas.

According to various example embodiments disclosed herein, an electronic device may include an injection-molded article produced using the method.

According to various example embodiments disclosed herein, a conductive layer or a conductive pattern may be electrically connected to a processor or a communication module to provide a function of an antenna, and may provide a stable wireless communication environment by being disposed to substantially face the external space on an injection-molded article. The conductive pattern may be disposed to substantially face the external space to form a continuous surface with a surface of a structure such as a housing (e.g., an injection-molded article), and may thus be easily concealed by a decoration layer and/or a primer layer. For example, the conductive pattern may not be visually and/or tactilely exposed to the outside, thereby improving design freedom in external design of an electronic device. In an embodiment, the conductive pattern has a sufficient thickness to prevent deterioration of electrical efficiency in wireless communication. In addition, various effects identified directly or indirectly via the disclosure may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
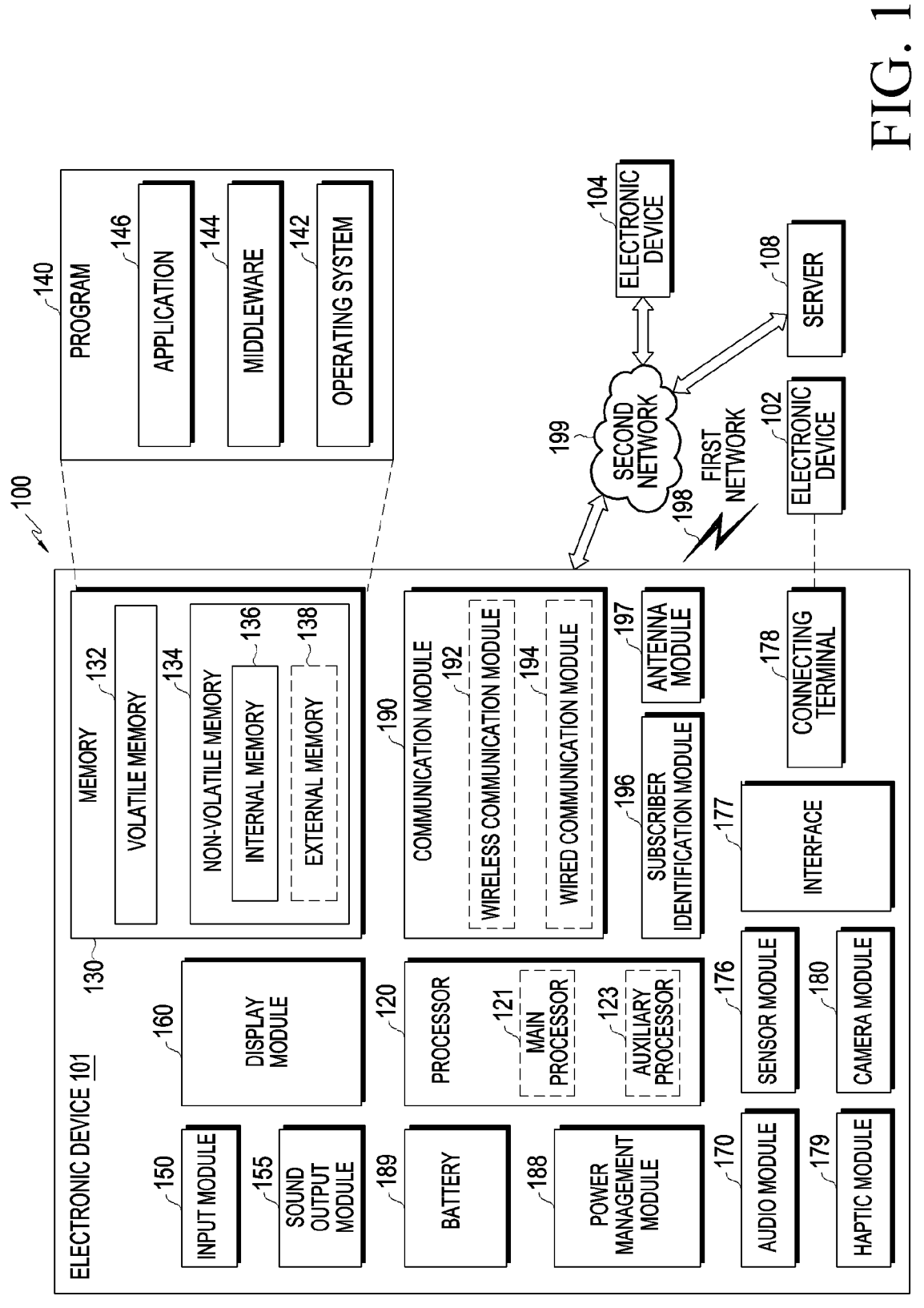
FIG. 1 is a block diagram illustrating an example electronic device in a network environment, according to various embodiments.

FIG. 1 is a block diagram illustrating an example electronic device 101 in a network environment 100 according to embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added.

Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
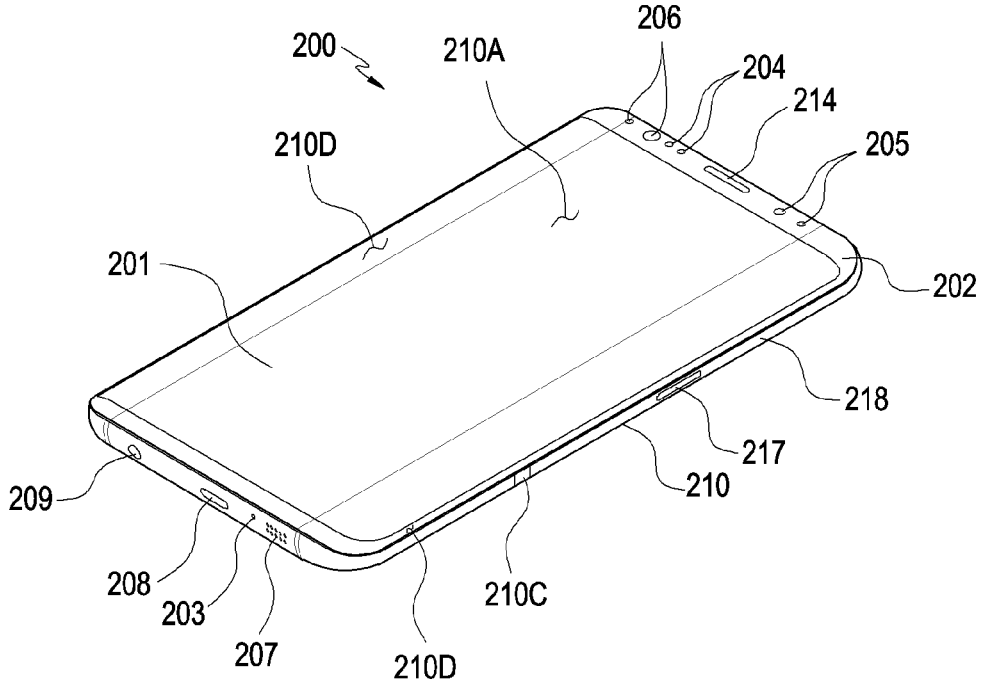
FIG. 2 is a front perspective view of an electronic device according to various embodiments.
Figure 3:
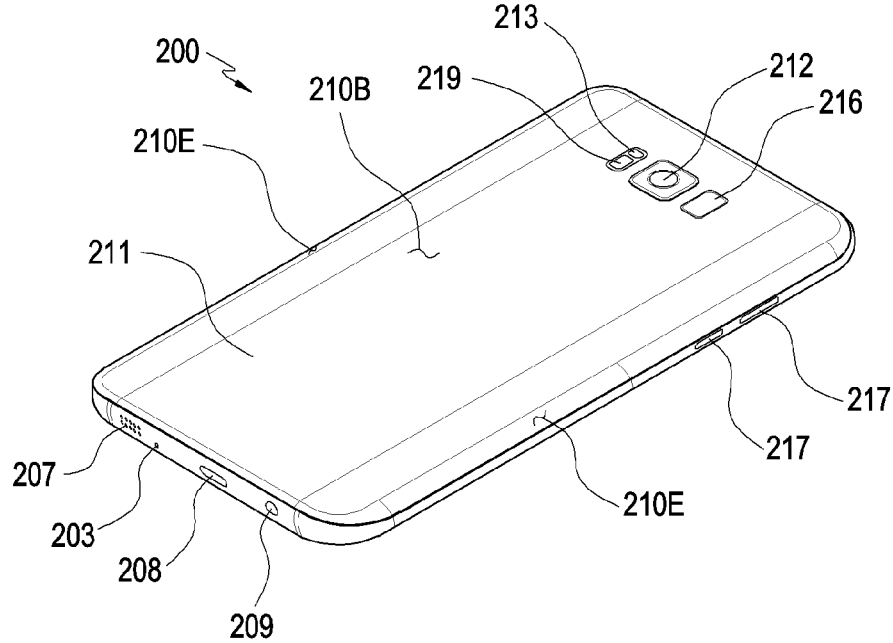
FIG. 3 is a rear perspective view of the electronic device shown in FIG. 2 according to various embodiments.

FIG. 2 is a front perspective view of an electronic device 200 according to various embodiments. FIG. 3 is a rear perspective view of the electronic device 200 shown in FIG. 2 according to various embodiments.

Referring to FIG. 2 and FIG. 3, an electronic device 200 according to an embodiment may include a housing 210 including a first surface (or a front surface) 210A, a second surface (or a rear surface) 210B, and a side surface 210C configured to surround a space between the first surface 210A and the second surface 210B. An embodiment (not shown), the housing 210 may refer to a structure forming a part among the first surface 210A of FIG. 2, the second surface 210B, and the side surface 210C of FIG. 3. In an embodiment, the housing may be interpreted as including a front plate 320, a side bezel structure 310, and/or a rear plate 380 in FIG. 4. According to an embodiment, the first surface 210A may be formed of a front plate 202 of which at least a part is substantially transparent (e.g., a polymer plate or a glass plate including various coating layers). In an embodiment, the front plate 202 may be coupled to the housing 210 to form an internal space together with the housing 210. The term "internal space" may refer to a space between the front plate 202 and a first support member (e.g., a first support member 311 of FIG. 4) to be described later. In various embodiments, the term "internal space" may refer to an internal space of the housing 210, the internal space accommodating at least a part of a display 201 or a display 330 of FIG. 4 to be described later.

According to various embodiments, the second surface 210B may be formed by a substantially opaque rear plate 211. The rear plate 211 may be formed, for example, of coated or colored glass, ceramic, polymer, metal (e.g., aluminum, stainless steel (STS), or magnesium), or a combination of at least two of the above-described materials. The side surface 210C may be coupled to the front plate 202 and the rear plate 211 and may be formed by a side bezel structure (or "side member") 218 including metal and/or polymer. In various embodiments, the rear plate 211 and the side bezel structure 218 may be integrally formed and may include the same material (e.g., a metal material such as aluminum).

In the shown embodiment, the front plate 202 may include two first areas 210D (e.g., curved areas) seamlessly extending from the first surface 210A to be bent toward the rear plate 211, at opposite ends of the long edges of the front plate 202. In the shown embodiment (see FIG. 3), the rear plate 211 may include two second areas 210E (e.g., curved areas) seamlessly extending from the second surface 210B to be bent toward the front plate 202, at opposite ends of the long edges thereof. In various embodiments, the front plate 202 (or the rear plate 211) may include only one of the first areas 210D (or the second areas 210E). In an embodiment, a part of the first areas 210D or the second areas 210E may not be included. In the embodiments, when viewed from the side surface of the electronic device 200, the side bezel structure 218 may have a first thickness (or width) at a side surface side where the first areas 210D or the second areas 210E described above are not included (e.g., the side surface through which a connector hole 208 is formed), and may have a second thickness smaller than the first thickness at a side surface side where the first areas 210D or the second areas 210E are included (e.g., the side surface on which key input devices 217 are arranged).

According to an embodiment, the electronic device 200 may include at least one among a display 201, audio modules 203, 207, and 214, sensor modules 204, 216, and 219, camera modules 205 and 212, key input devices 217, a light emitting element 206, and connector holes 208 and 209. In various embodiments, the electronic device 200 may omit at least one of the elements (e.g., the key input devices 217 or the light emitting element 206) or may additionally include other elements.

For example, the display 201 may be exposed (e.g., visible) via a significant portion of the front plate 202. In various embodiments, at least a part of the display 201 may be visible via the front plate 202 forming the first surface 210A and the first areas 210D of the side surface 210C. In various embodiments, the edge of the display 201 may be formed to be substantially identical to an adjacent outer periphery of the front plate 202. In an embodiment (not shown), in order to expand the area where the display 201 is visible, the gap between the outer periphery of the display 201 and the outer periphery of the front plate 202 may be formed to be substantially the same. As used herein with reference to the display, the terms "exposed", "visually exposed" and "visible" may be used interchangeably and include a display having a cover glass, cover layer, protective layer, or the like disposed thereon.

In an embodiment (not shown), a recess or an opening may be formed in a part of a screen display area (e.g., an active area) or an area outside the screen display area (e.g., an inactive area) of the display 201, and at least one among an audio module 214, a sensor module 204, a camera module 205, and a light emitting element 206 may be included to be arranged with the recess or the opening. In an embodiment (not shown), at least one of the audio module 214, the sensor module 204, the camera module 205, the fingerprint sensor 216, and the light emitting element 206 may be included on the rear surface of the screen display area of the display 201. In an embodiment (not shown), the display 201 may be coupled to or disposed adjacent to a touch detection circuit, a pressure sensor capable of measuring the intensity (pressure) of a touch, and/or a digitizer configured to detect a magnetic stylus pen. In an embodiment, at least a part of the sensor modules 204 and 219 and/or at least a part of the key input devices 217 may be disposed in the first areas 210D and/or the second areas 210E.

The audio modules 203, 207, and 214 may include a microphone hole 203 and speaker holes 207 and 214. A microphone configured to acquire external sound may be disposed inside the microphone hole 203, and in various embodiments, a plurality of microphones may be arranged to detect the direction of sound. The speaker holes 207 and 214 may include an external speaker hole 207 and a receiver hole 214 for calls. In various embodiments, the speaker holes 207 and 214 and the microphone hole 203 may be implemented as one hole, or a speaker may be included without the speaker holes 207 and 214 (e.g., a piezo speaker).

The sensor modules 204, 216, and 219 may produce electrical signals or data values corresponding to an internal operating state of the electronic device 200 or an external environmental state. The sensor modules 204, 216, and 219 may include, for example, a first sensor module 204 (e.g., a proximity sensor) and/or a second sensor module (not shown) (e.g., a fingerprint sensor) disposed on the first surface 210A of the housing 210, and/or a third sensor module 219 (e.g. an HRM sensor) and/or a fourth sensor module 216 (e.g. a fingerprint sensor) disposed on the second surface 210B of the housing 210. The fingerprint sensor may be disposed not only on the first surface 210A (e.g., the display 201) of the housing 210, but also on any one of the second surface 210B and the side surface 210C. The electronic device 200 may further include a sensor module not shown, for example, at least one of a gesture sensor, a gyro sensor, an air pressure sensor, a magnetic sensor, an acceleration sensor, a grip sensor, a color sensor, an infrared (IR) sensor, a biometric sensor, a temperature sensor, and a humidity sensor, or an illuminance sensor.

The camera modules 205 and 212 may include a first camera module 205 disposed on the first surface 210A of the electronic device 200, and a second camera module 212 and/or a flash 213 disposed on the second surface 210B. The camera modules 205 and 212 may include one or more lenses, an image sensor, and/or an image signal processor.

The flash 213 may include, for example, a light emitting diode or a xenon lamp. In various embodiments, three or more lenses (infrared camera, wide-angle and telephoto lenses) and image sensors may be arranged on one surface of the electronic device 200.

The key input devices 217 may be arranged on the side surface 210C of the housing 210. In an embodiment, the electronic device 200 may not include a part or all of the above-described key input devices 217, and the key input devices which are not included may be implemented on the display 201 as a different form such as a soft key. In various embodiments, the key input devices may include a sensor module 216 disposed on the second surface 210B of the housing 210.

The light emitting element 206 may be disposed, for example, on the first surface 210A of the housing 210. The light emitting element 206 may provide state information of the electronic device 200 in the form of light. In an embodiment, the light emitting element 206 may provide, for example, a light source interlocked with the operation of the camera module 205. The light emitting element 206 may include, for example, an LED, an IR LED, and a xenon lamp.

The connector holes 208 and 209 may include a first connector hole 208 capable of receiving a connector (e.g., a USB connector) configured to transmit and receive power and/or data to and from an external electronic device, and/or a second connector hole (e.g., an earphone jack) 209 capable of accommodating a connector configured to transmit and receive audio signals to and from an external electronic device.

According to various embodiments, the electronic device may include a bar-type or a plate-type appearance but is not limited thereto. For example, the illustrated electronic device 200 may be a part of a foldable electronic device, a slidable electronic device, a stretchable electronic device, and/or a rollable electronic device. The terms a "foldable electronic device", a "slidable electronic device", a "stretchable electronic device", and/or a "rollable electronic device" may indicate an electronic device of which at least a part is foldable, windable or rollable, is at least partially expendable, and/or is capable of being accommodated inside the housing 210, because bending deformation of the display 201 (e.g., the display module 160 of FIG. 1) is possible. The foldable electronic device, the slidable electronic device, the stretchable electronic device, and/or the rollable electronic device may expand and use a screen display area by unfolding a display or exposing a larger area of the display according to the user's needs.

Figure 4:
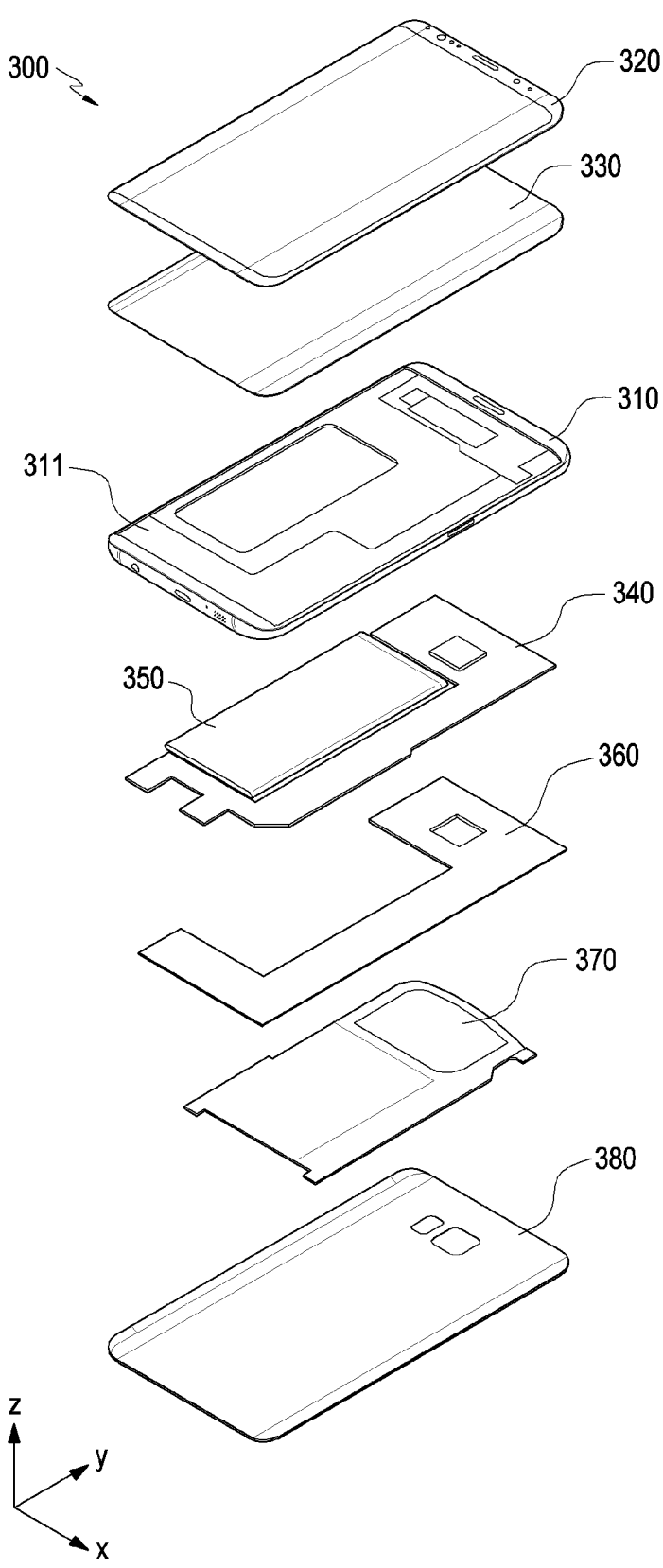
FIG. 4 is an exploded perspective view of the electronic device shown in FIG. 2 according to various embodiments.

FIG. 4 is an exploded perspective view of the electronic device 200 shown in FIG. 2 and FIG. 3 according to various embodiments.

Referring to FIG. 4, an electronic device 300 may include a side bezel structure 310, a first support member 311 (e.g., a bracket), a front plate 320, a display 330, a printed circuit board 340, a battery 350, a second support member 360 (e.g., a rear case), an antenna 370, and a rear plate 380. In various embodiments, the electronic device 300 may omit at least one of the elements (e.g., the first support member 311 or the second support member 360) or may additionally include another element. At least one of the elements of the electronic device 300 may be the same as or similar to at least one of the elements of the electronic device 200 of FIG. 2 or FIG. 3, and duplicate descriptions may not be repeated below.

The first support member 311 may be disposed inside the electronic device 300 and connected to the side bezel structure 310, or may be integrally formed with the side bezel structure 310. The first support member 311 may be configured, for example, of a metal material and/or a non-metal (e.g., polymer) material. The first support member 311 may have one surface coupled to the display 330 and the other surface coupled to the printed circuit board 340. A processor, a memory, a communication module, and/or an interface (e.g., the processor 120, the memory 130, the communication module 190, and/or the interface 177 of FIG. 1) may be mounted on the printed circuit board 340. The processor may include, for example, one or more among a central processing unit, an application processor, a graphic processing unit, an image signal processor, a sensor hub processor, or a communication processor.

Substantially, the entire area of the display 330 may be attached to the inner surface of the front plate 320, and, on the inner surface of the front plate 320, an opaque layer may be formed around or at the periphery of the area to which the display 330 is attached. In an area of the front plate 320 where the display 330 is not disposed, the opaque layer may block a portion of an internal structure (e.g., the first support member 311) of the electronic device 300 from being exposed to the outside.

The memory may include, for example, a volatile memory or a non-volatile memory.

The interface may include, for example, a high definition multimedia interface (HDMI), a universal serial bus (USB) interface, an SD card interface, and/or an audio interface. The interface may electrically or physically connect the electronic device 300 to an external electronic device, and may include a USB connector, an SD card/MMC connector, or an audio connector.

The battery 350 is a device configured to supply power to at least one element of the electronic device 300, and may include, for example, a non-rechargeable primary battery, a rechargeable secondary battery, or a fuel cell. At least a part of the battery 350 may be disposed, for example, substantially on the same plane as the printed circuit board 340. The battery 350 may be integrally disposed inside the electronic device 300, and may be detachably disposed in the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may, for example, perform short-distance communication with an external device or wirelessly transmit/receive power required for charging. In an embodiment, an antenna structure may be formed by a part or a combination of the side bezel structure 310 and/or the first support member 311.

According to various embodiments, the antenna 370 may include a plating layer or a conductive pattern (e.g., the conductive pattern 411 of FIG. 5 and/or FIG. 6), which will be described later, and the electronic device 300 (e.g., the processor 120 and/or the communication module 190 of FIG. 1) may be configured to perform wireless communication using a plating layer or a conductive pattern. In an embodiment, the processor 120 and/or the communication module 190 may be disposed on the printed circuit board 340, and may be provided with a connection terminal such as a C-clip or a POGO pin (not shown) to electrically connect a conductive pattern 411 to the printed circuit board 340 (e.g., the processor 120 and/or the communication module 190).

Figure 5:
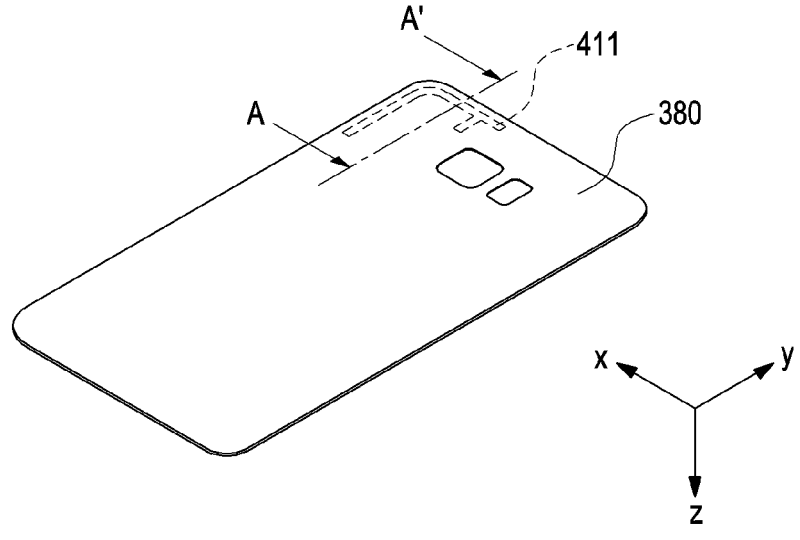
FIG. 5 is a perspective view illustrating a rear surface of a housing of an electronic device according to various embodiments.
Figure 6:
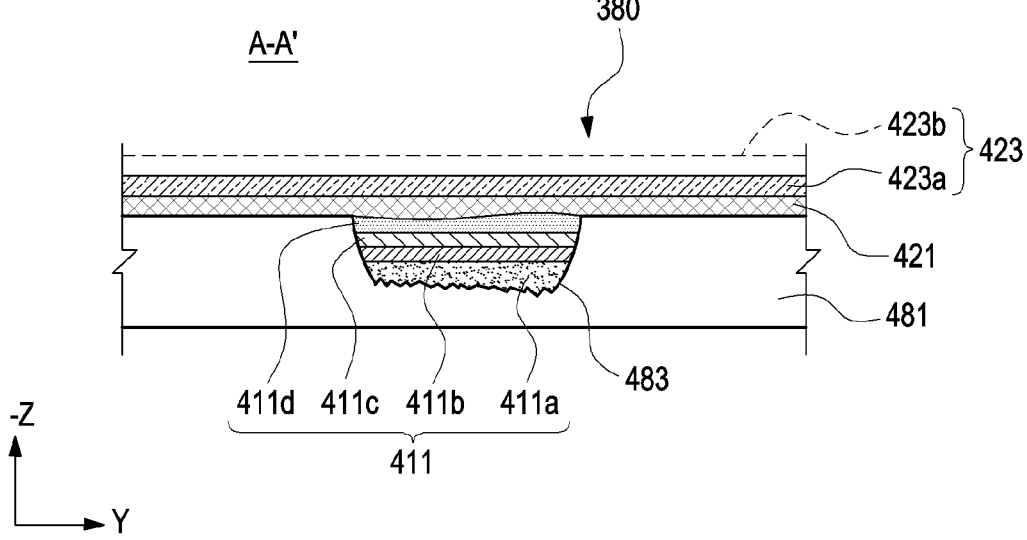
FIG. 6 is a partial cross-sectional view of the housing of the electronic device taken along line A-A' of FIG. 5 according to various embodiments.

FIG. 5 is a perspective view illustrating a rear surface (e.g., the outer surface of the rear plate 380 of FIG. 4) of a housing of an electronic device (e.g., the electronic device 101, 102, 104, 200, and 300 of FIGS. 1 to 4) according to various embodiments. FIG. 6 is a partial cross-sectional view of the housing of the electronic device 300 taken along line A-A' of FIG. 5 according to various embodiments.

Referring to FIG. 5 and FIG. 6, a housing (e.g., the housing 210 of FIG. 2) of the electronic device 300, for example, the rear plate 380 may at least partially include a polymer material. In an embodiment, the rear plate 380 may be an injection-molded article produced by injection molding and may include a plating layer or a conductive pattern 411 disposed on at least a part of a polymer material portion 481. In an embodiment, the plating layer or the conductive pattern 411 may be disposed on a surface facing the external space, for example, on at least a part of the outer surface of the rear plate 380. In an embodiment, the conductive pattern 411 may form the rear plate 380 together with the polymer material portion 481. In an embodiment, the conductive pattern 411 may not be visually and/or tactilely exposed on the outer appearance of the housing or the rear plate 380. For example, the surface of the conductive pattern 411 may be tactilely recognized by forming a continuous flat or curved surface with the outer surface of the polymer material portion 481 and may be visually hidden by a primer layer 421 or decoration layer(s) 423 formed on the surface of the rear plate 380. In an embodiment, the conductive pattern 411 may be formed on the outer surface of the housing or the rear plate 380 and to be substantially open to the external space, and thus, when the conductive pattern 411 is used as an antenna (e.g., a radiation conductor), wireless communication efficiency (e.g., gain or power efficiency) may be improved. For example, compared to the structure disposed on the inner surface of the housing, the efficiency of wireless communication using the conductive pattern 411 formed on the outer surface of the rear plate 380 may be improved.

According to various embodiments, a processing groove 483 configured to receive the plating layer or the conductive pattern 411 may be formed on the outer surface of the rear plate 380. The processing groove 483 may be formed to be recessed on the surface of the rear plate 380 (e.g., the polymer material portion 481), and, when viewed from the outside of the electronic device (e.g., the electronic device 300 in FIG. 4), the processing groove 483 and/or the conductive pattern 411 may at least partially extend in the longitudinal direction (e.g., the Y-axis direction in FIG. 4) or the width direction (e.g., the X-axis direction in FIG. 4) of the electronic device 300. According to an embodiment, the processing groove 483 may be formed by processing the surface of the polymer material portion 481 by laser beam processing. Via such surface processing, the bottom surface or the inner wall of the processing groove 483 may have surface roughness sufficient to facilitate plating.

According to various embodiments, the plating layer or the conductive pattern 411 may be implemented as plating layer(s) 411a, 411b, 411c, and 411d including at least one metal material (e.g., at least one of nickel (Ni), copper (Cu), or silver (Ag)). For example, in the shown embodiment, four plating layers 411a, 411b, 411c, and 411d from the bottom surface of the processing groove 481 may be included. In an embodiment, a first plating layer 411a formed on the bottom surface of the processing groove 483 may be formed by nickel plating, a second plating layer 411b may be formed on the surface of the first plating layer 411a by copper plating, and a third plating layer 411c may be formed on the surface of the second plating layer 411b by silver plating. According to an embodiment, silver plating may be omitted, and, when silver plating is omitted, another plating layer (e.g., the second plating layer 411b) may be formed thicker. A fourth plating layer 411d may be formed on the surface of the second plating layer 411b or the surface of the third plating layer 411c by nickel plating. As described above, the surface of the conductive pattern 411 may form a continuous flat surface or a continuous curved surface with the surface of the polymer material portion 481, and thus the conductive pattern 411 on the surface of the rear plate 380 may not be tactilely recognized. In an embodiment, the surface of the conductive pattern 411 may form a continuous flat surface or a continuous curved surface with the surface of the polymer material portion 481, but may be partially formed lower or deeper than the surface of the polymer material portion 481.

According to various embodiments, the electronic device 300, the housing 210, and/or the rear plate 380 may include decoration layers 423 formed on a surface, for example, on (above) the surface of the polymer material portion 481 and/or the surface of the conductive pattern 411. The decoration layers 423 may include, for example, at least one among a deposition layer, a plating layer, a printing layer, or a paint layer. In an embodiment, any one of a deposition layer, a plating layer, a printing layer, or a paint layer may be selected, and the selected layer may be provided in plurality to form the decoration layers 423. In an embodiment, two or more layers selected from a deposition layer, a plating layer, a printing layer, or a paint layer may be provided to form the decoration layers 423. In an embodiment, when a deposition layer and a printing layer are combined, a plurality of printing layers may be provided. For example, the type or number of layers forming the decoration layers 423 may be variously selected in consideration of the outer appearance of an actually manufactured electronic device.

According to various embodiments, the decoration layers 423 may be formed on the outer surface of the rear plate 380 as an example, but additional decoration layers not shown may be formed on the inner surface of the rear plate 380. According to an embodiment, a primer layer 421 may be provided on the surface of the rear plate 380 prior to the decoration layers 423 to increase affinity between the paint forming the decoration layers 423 and the polymer material portion 481 and/or a metal material portion (not shown). In an embodiment, the decoration layers 423 may include a color layer 423a or a coating layer 423b formed of an ultraviolet curing material. In order to implement a designated color, a plurality of color layers 423a may be provided.

According to various embodiments, even if the surface of the conductive pattern 411 and the surface of the polymer material portion 481 have different colors or a difference in light reflectance, the conductive pattern 411 may be visually concealed. For example, the primer layer 421 or the decoration layers 423 (e.g., the color layer 423a) may be substantially opaque, and thus, the color or the light reflectance of the outer appearance of the electronic device 300 (e.g., the surface of the rear plate 380) may be determined by the decoration layers 423. In an embodiment, the conductive pattern 411 may be formed with various characters or designs to provide a decorative effect on the outer appearance of the electronic device 300, and thus, the primer layer 421 or the decoration layers 423 may be formed to be at least partially transparent or translucent.

According to various embodiments, the depth of the processing groove 483 and/or the thickness of the conductive pattern 411 may be at least partially greater than or equal to approximately 20 um, and the conductive pattern 411 may have low electrical resistance characteristics when functioning as an antenna. In an embodiment, in functioning as an antenna, the conductive pattern 411 may have a low resistance loss when the thickness thereof is approximately 11 um or more, and, in the method of producing an injection-molded article according to various embodiments disclosed herein, the thickness of the conductive pattern 411 may be secured at a predetermined level (e.g., approximately 11 μm or more) throughout the area where the processing groove 483 is formed, thereby enabling electrical signals to flow smoothly. For example, when the conductive pattern 411 is used as an antenna, loss due to electrical resistance of the conductive pattern 411 itself may be prevented and/or reduced. The conductive pattern 411 and/or a method for producing an injection-molded article having the conductive pattern 411 will be described in greater detail below with reference to FIGS. 7 to 10. Some elements of the preceding embodiments may be referred to in describing a method of producing an injection-molded article.

Figure 7:
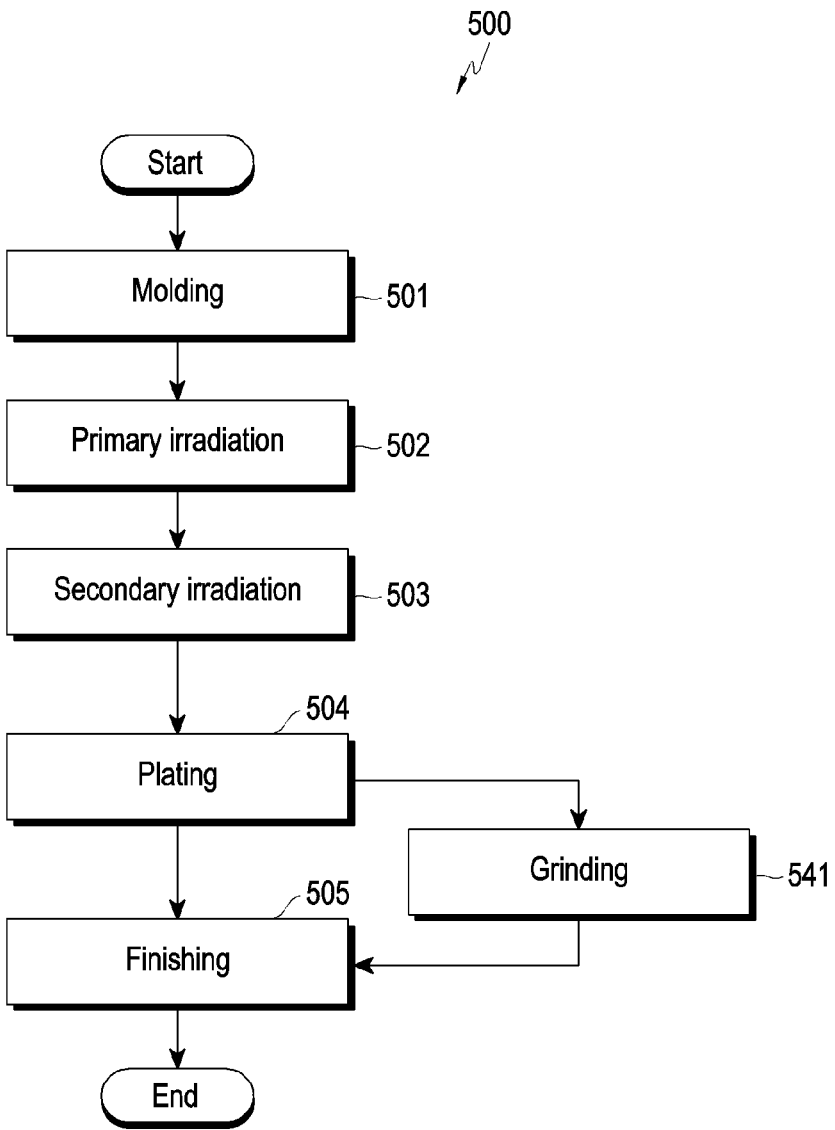
FIG. 7 is a flowchart illustrating an example method for producing an injection-molded article or a housing of an electronic device according to various embodiments.
Figure 8:
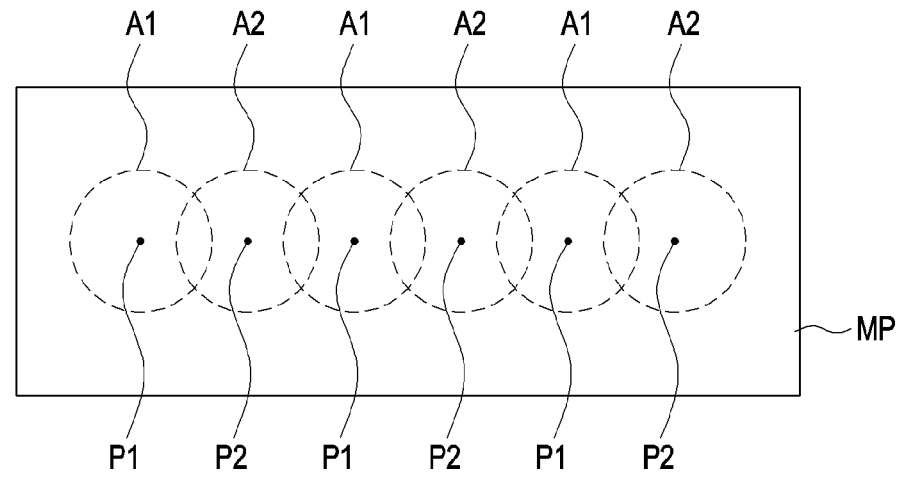
FIG. 8 is a diagram illustrating areas to which a laser is irradiated, in a method for producing an injection-molded article according to various embodiments.
Figure 9:
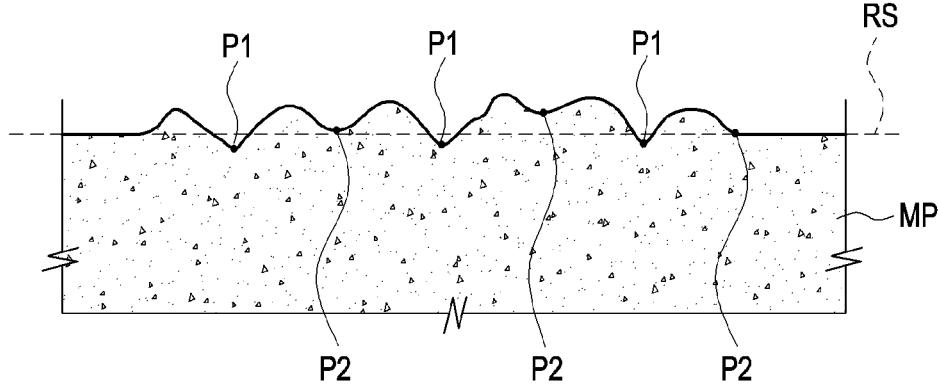
FIG. 9 is a cross-sectional view illustrating part of the injection-molded article after a primary laser has irradiated the injection-molded article, in a method for producing an injection-molded article according to various embodiments.
Figure 10:
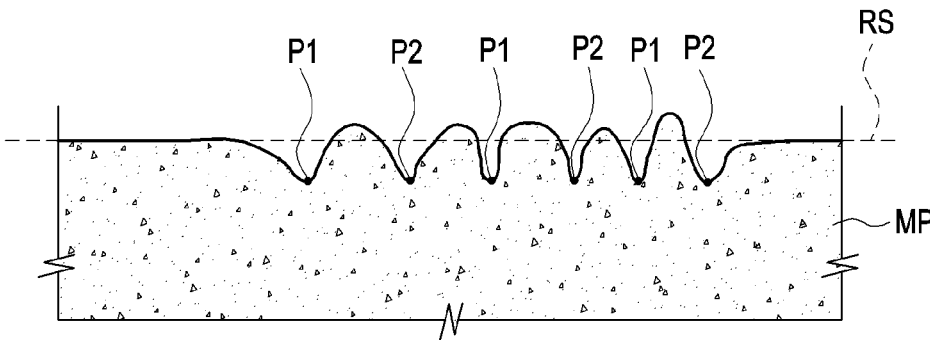
FIG. 10 is a cross-sectional view illustrating part of the injection-molded article after a secondary laser has irradiated the injection-molded article, in a method for producing an injection-molded article according to various embodiments.

FIG. 7 is a flowchart illustrating an example method 500 for producing an injection-molded article or a housing (e.g., the housing 210 or the rear plate 380 of FIGS. 2 to 5) of an electronic device according to various embodiments. FIG. 8 is a diagram illustrating areas A1 and A2 to which a laser is irradiated, in a method 500 for producing an injection-molded article according to various embodiments. FIG. 9 is a partial cross-sectional view illustrating the injection-molded article MP after a primary laser has irradiated the injection-molded article, in a method 500 for producing an injection-molded article according to various embodiments. FIG. 10 is a partial cross-sectional view illustrating the injection-molded article MP after a secondary laser has irradiated the injection-molded article, in a method 500 for producing an injection-molded article according to various embodiments.

First, referring to FIG. 7, a method 500 for producing an injection-molded article (e.g., the rear plate 380 of FIGS. 4 to 6) according to various embodiments disclosed herein may include a molding operation 501, a primary irradiation operation 502, a secondary irradiation operation 503, a plating operation 504, and a finishing operation 505, and, according to an embodiment, may further include a grinding operation 541 before the finishing operation 505. Although not shown, before performing the operations listed above, cleaning operation(s) for removing contaminants from the surface of the injection-molded article or workpiece may be further included, which may be easily understood by a person skilled in the art, and detailed description thereof may not be repeated.

According to various embodiments, the molding operation 501 may be an operation of injecting molten resin into a mold, cooling, and curing same, and the shape of an injection-molded article (e.g., the rear plate 380 of FIGS. 4 to 6 or the injection-molded article MP of FIGS. 8 to 10) to be produced may be substantially formed via the molding operation 501. In an embodiment, before injecting the molten resin, at least one metal member (e.g., a decoration member) may be disposed in the mold so that the molten resin is cured and the metal member is coupled to the injection-molded article MP. In an embodiment, the polymer material portion 481 of FIG. 6 may be substantially molded by the molding operation 501, and a processing groove (e.g., the processing groove 483 of FIG. 6) may not yet be formed in the polymer material portion 481 formed by the molding operation 501.

According to various embodiments, the primary irradiation operation 502 may include an operation of irradiating a laser beam to at least a part of the surface of the injection-molded article M or the injection-molded polymer material portion 481, and may irradiate a plurality of lasers to areas (e.g., the primary irradiation areas A1) spaced apart from each other. In an embodiment, the irradiated laser or the laser irradiation areas A1 may have a diameter of approximately 40 um or more and 70 um or less, and in the primary irradiation operation 502, the laser irradiation areas A1 may be arranged at designated intervals to be avoid overlapping each other. According to an embodiment, when the surface of the injection-molded article MP is configured to be a reference surface RS, the centers of the areas (e.g., the primary irradiation areas A1) irradiated with a laser by the primary irradiation operation 502 may be deeper than the reference surface RS, the peripheries of the primary irradiation areas A1 may be higher than the reference surface RS. Generally, the centers of the primary irradiation areas A1 may be the deepest, and the closer to the edges thereof, the shallower valleys (e.g., the valleys V1, V1, V3, . . . Vn of FIGS. 12 to 15) or grooves (recesses) may be formed on the surface of the injection-molded article MP. In this regard, further reference will be made to FIG. 8 and FIG. 9.

In FIG. 8, areas indicated by "A1" illustrate primary irradiation areas to which laser is irradiated in the primary irradiation operation 502, and points indicated by "P1" in the primary irradiation operation 502 illustrate, for convenience of explanation, the first points where the laser is irradiated. In FIG. 8, areas indicated by "A2" illustrate secondary irradiation areas to which laser is irradiated in the secondary irradiation operation 503, and points indicated by "P2" in the secondary irradiation operation 503 illustrate, for convenience of explanation, the second points where the laser is irradiated. According to an embodiment, in FIG. 8, the first points P1 may be the centers of the primary irradiation areas A1, and first points P1 in FIG. 9 may not coincide the first points P1 in FIG. 8. For example, depending on the time point or environmental conditions at which the primary irradiation operation 502 is performed, the surface of the injection-molded article MP may have a different tendency to be deformed or deteriorated by the laser, and in FIG. 9, the intervals or depths of the first points P1 may vary depending on the product within a designated range. For example, in describing the various embodiments disclosed herein, for convenience of explanation, the points to which the laser is irradiated are indicated, for example, in the drawings, and the cross-sectional shape of the first points P1 or the injection-molded article MP in the actually produced product may be slightly different from that illustrated in the drawings.

Referring further to FIG. 8 and FIG. 9, as the primary irradiation operation 502 is performed, the surface of the injection-molded article MP may be recessed deeper than the reference surface RS at least at the first points A1, and valleys or recesses which gradually become shallower as the distances from the first points A1 increase may be formed. In an embodiment, the surface of the injection-molded article MP may protrude higher than the reference surface RS in the middle portion between the first points P1. For example, by the primary irradiation operation 502, the surface of the injection-molded article MP may at least partially have an uneven shape in which valleys or recesses and mountain-shaped portions are alternately arranged.

According to various embodiments, it may be difficult to form a plating layer or a conductive pattern on the flat surface of the injection-molded article MP by plating or deposition. For example, when the surface of the injection-molded article MP has a designated level of roughness, affinity with metal particles may be high and plating or deposition efficiency may be high. According to various embodiments disclosed herein, in producing an injection-molded article (e.g., the housing 210 or the rear plate 380 of FIGS. 2 to 5) including a plating layer or a conductive pattern (e.g., the conductive pattern 411 of FIG. 6), by performing the primary irradiation operation 502 and/or the secondary irradiation operation 503, the plating or deposition efficiency may be increased by roughening the surface of the injection-molded article MP.

According to various embodiments, when a plating layer or a conductive pattern is formed in the state in which the primary irradiation operation 502 is performed, for example, when formed on the surface of the injection-molded article MP in the state illustrated in FIG. 9, the plating layer or the conductive pattern may protrude from the surface of the injection-molded article MP. When the plating layer or the conductive pattern is disposed toward the external space to ensure high transmission and reception efficiency of a wireless signal, the plating layer or the conductive pattern may be visually or tactilely recognized on the outer appearance of the injection-molded article MP or an electronic device (e.g., the electronic device 101, 102, 104, 200, and 300 of FIGS. 1 to 4) including the injection-molded article MP, thereby deteriorating the outer appearance of the injection-molded article MP or the electronic device. In an embodiment, a printing layer (e.g., the decoration layers 423 of FIG. 6) which has a thickness greater than the height or the thickness of the plating layer or the conductive pattern protruding further than the reference surface may be formed to prevent and/or reduce the plating layer or the conductive pattern from being visually or tactilely recognized. However, production cost may increase as the thickness of the coating layer increases, and the thickness of the electronic device may also increase.

In various embodiments disclosed herein, by including the secondary irradiation operation 503, a recess (e.g., the processing groove 483 of FIG. 6) lower than the reference surface RS or deeper than the reference surface RS may be formed. For example, the plating layer or the conductive pattern may be formed in the processing groove 483 to form a substantially continuous flat surface or a continuous curved surface with the surface of the area to which the laser has not been irradiated, thereby harmonizing with the outer appearance of the injection-molded article MP or the electronic device. In an embodiment, the processing groove 483, the plating layer, or the conductive pattern may have a designated depth or thickness (e.g., approximately 11 μm or more), and may thus have a low electrical resistance and function as an antenna having good power efficiency.

According to various embodiments, the secondary irradiation operation 503 may include an operation for irradiating laser to areas different from the primary irradiation areas A1 on at least a part of the surface of an injection-molded article (e.g., the housing 210 or the rear plate 380 of FIGS. 2 to 6) or the injection-molded article MP, the secondary irradiation areas A2 may at least partially overlap at least one of the primary irradiation areas A1. For example, the secondary irradiation areas A2 may be substantially alternately arranged with the primary irradiation areas A1 and may partially overlap at least one adjacent primary irradiation area A1. In an embodiment, one secondary irradiation area A2 may overlap two primary irradiation areas A1 adjacent thereto, and one primary irradiation area A1 and one secondary irradiation area A2 may overlap each other in a range of approximately 20% or more and 30% or less of the laser diameter. In an embodiment, the secondary irradiation operation 503 is different from the primary irradiation operation with respect to the points where the laser is irradiated, and other conditions or settings for irradiating the laser may be substantially similar to or the same as those of the primary irradiation operation 502.

According to various embodiments, in the primary irradiation operation 502 and the secondary irradiation operation 503, when the lasers have the same diameter of approximately 50 μm, the maximum width of an area where one primary irradiation area A1 and one secondary irradiation area A2 overlap each other may be approximately 10 μm or more and 15 μm or less. The "maximum width of the overlapping area" may indicate the maximum value of the width measured in the direction in which the primary irradiation areas A1 and the secondary irradiation areas A2 are arranged, and may substantially indicate the width measured on a straight line passing via the first points P1 and the second points P2 in FIG. 8. For example, when a laser having a diameter of approximately 50 um is irradiated in the primary irradiation operation 502 and the secondary irradiation operation 503, the interval between the first point P1 and the second point P2 may be approximately 85 um or more and approximately 90 um or less. It should be noted that the diameter of the laser or the maximum width of the overlapping area is not limited to the values mentioned above. For example, the diameter of the laser may be appropriately selected in the range of approximately 40 um or more and 70 um or less, and the maximum width of an area where the primary irradiation area A1 and the secondary irradiation area A2 overlap each other may vary according to the diameter of the selected laser.

According to various embodiments, in the primary irradiation operation 502, the tissue or molecular structure of the injection-molded article MP may be altered in the areas where the laser has been irradiated or the heat of the laser has reached. For example, the material included in the injection-molded article MP may be easily scattered or removed in the secondary irradiation operation 503 or in a cleaning operation (not shown) at least in the areas between the first points P1 (e.g., the secondary irradiation areas A2). Accordingly, the portions or areas to which the laser is irradiated in the primary irradiation operation 502 and the secondary irradiation operation 503 may form a recess (e.g., the processing groove 483 of FIG. 6) substantially lower than the surface of the injection-molded article MP or the reference surface RS. FIG. 10 is a cross-sectional view illustrating the surface of the injection molded article MP or the injection-molded article in a state in which the secondary irradiation operation 503 is performed, and a portion between the first points P1 and the second points P2 may protrude higher than the reference surface. However, as mentioned above, the tissue or molecular structure of the injection-molded article MP may be altered in the areas where the laser has been irradiated or the heat of the laser has reached, and thus, at least mountain-shaped portions between the first points P1 and the second points P2 may be easily scattered or removed. In an embodiment, in a cleaning operation to remove contaminants before forming a plating layer or a conductive pattern in areas where a laser has been irradiated, the areas where the laser has been irradiated or the areas where the heat of the laser has reached may form a recess (e.g., the processing groove 483 of FIG. 6) substantially lower or deeper than the reference surface RS.

According to various embodiments, the plating operation 504 may include an operation of forming a plating layer or a conductive pattern (e.g., the conductive pattern 411 in FIG. 6) in areas where a laser has been irradiated (e.g., the processing groove 483 in FIG. 6), and as illustrated in FIG. 6, the surface of the plating layer or the conductive pattern may form substantially a continuous curved surface or a continuous flat surface with the surface of the injection-molded article MP. The "surface of the injection-molded article MP" may refer, for example, to the surface of an injection-molded article (e.g., the housing 210 or the rear plate 380 of FIGS. 2 to 6) or an area on the injection-molded article MP, to which a laser has not been irradiated, and in an embodiment, "the surface of the injection-molded article or the surface of the polymer material portion 481 of FIG. 6" may be used to indicate including the surface of a plating layer or a conductive pattern (e.g., the conductive pattern 411 of FIG. 6). According to an embodiment, the surface of the plating layer or the conductive pattern may be formed partially lower than the reference surface RS or the polymer material portion 481 of FIG. 6, and the surface of the plating layer or the conductive pattern may be a curved surface. In an embodiment, the plating layer or the conductive pattern may include at least one among a nickel layer, a copper layer, a silver layer, and/or a second nickel layer (e.g., the first to fourth plating layers 411*a*, 411*b*, 411*c*, and 411*d* of FIG. 6) formed in the processing groove 483 of FIG. 6, which has been previously described with reference to FIG. 6, and thus a detailed description thereof may not be repeated here.

According to various embodiments, after the plating operation 504, the grinding operation 541 may be selectively performed. For example, when the plating layer or the conductive pattern 411 partially protrudes higher than the reference surface or the surface of the injection-molded article, a protruding portion of the plating layer or the conductive pattern 411 may be at least partially removed in a grinding operation.

According to various embodiments, the finishing operation 505 is an operation of forming a decoration layer (e.g., the decoration layers 423 of FIG. 6) on the surface of the injection-molded article MP or the polymer material portion 481 of FIG. 6, and the decoration layers 423 may be formed via at least one process of deposition, plating, printing, or painting. For example, the decoration layers 423 may include at least one of a deposition layer, a plating layer, a printing layer, or a paint layer, which has been described above with reference to FIG. 6, and thus a detailed description thereof may not be repeated here. According to an embodiment, the finishing operation 505 may further include forming the primer layer 421 before forming the decoration layers 423, and the primer layer 421 may increase the affinity or adhesion between the surface of the injection-molded article, the plating layer, or the conductive pattern 411 and the material forming the decoration layers 423.

As described above, an area where the plating layer or the conductive pattern 411 is to be formed via the primary irradiation operation 502 or the secondary irradiation operation 503 may substantially form a recess (e.g., the processing groove 483 of FIG. 6) having a designated depth on the surface of an injection-molded article (e.g., the polymer material portion 481 of FIG. 6 or the injection-molded article MP of FIGS. 8 to 10). For example, the plating layer or the conductive pattern 411 may have low electrical resistance characteristics by having a specified thickness (e.g., approximately 11 um or more), and may prevent and/or reduce power efficiency from deteriorating when functioning as an antenna.

According to various embodiments, electronic elements producing heat (e.g., an integrated circuit chip on which the processor 120 or the communication module 190 of FIG. 1 is disposed) may be arranged in a highly integrated electronic device (e.g., the electronic device 101, 102, 104, 200, and 300 of FIGS. 1 to 4), and, as the internal temperature of the electronic device increases, power efficiency of the electronic elements may decrease. In an embodiment, an electronic device (e.g., the processor 120 of FIG. 1) may suppress heat production in an electronic element by forcibly limiting the performance of the electronic element. For example, power efficiency may be lowered due to heat produced from electronic elements, or the electronic elements may operate with lower performance than design specifications. In an embodiment, by quickly dispersing or dissipating heat produced inside the electronic device to a wider area or an external space, an increase in internal temperature of the electronic device may be suppressed and an environment in which the electronic elements may exhibit designed performance may be provided.

According to various embodiments, in the injection-molded article MP or the polymer material portion 481, a plating layer or a conductive pattern may be formed in an area adjacent to an electronic element producing heat to function as a heat dissipation structure or a heat transfer structure. For example, by forming a plating layer or a conductive pattern using a material having high thermal conductivity, the injection-molded article MP or the polymer material portion 481 may function as a heat dissipation structure. In this regard, further reference will be made to FIGS. 11 to 15.

Figure 11:
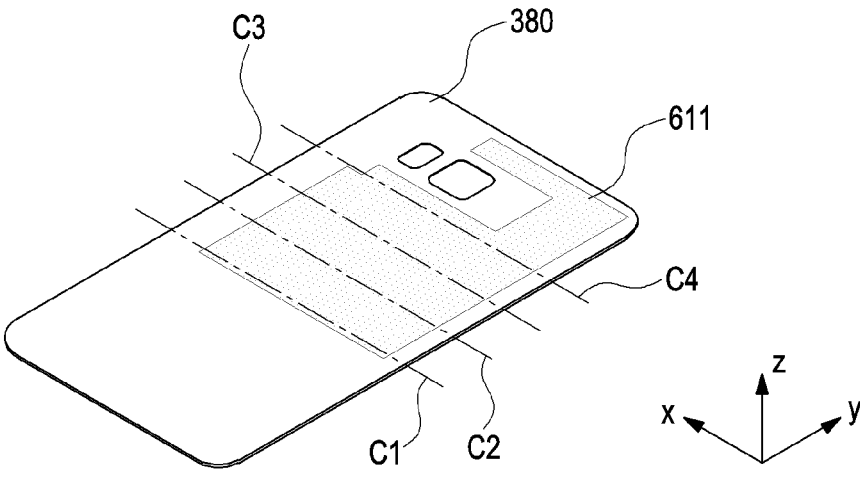
FIG. 11 is a perspective view illustrating an injection-molded article or a plate of an electronic device, produced using a method for producing an injection-molded article according to various embodiments.

FIG. 11 is a perspective view illustrating an injection-molded article (e.g., the injection-molded article MP of FIGS. 8 to 10) or a plate (e.g., the rear plate 380 of FIGS. 4 to 6) of an electronic device, produced using a method (e.g., the method 500 of FIG. 7) for producing an injection-molded article according to various embodiments.

Referring further to FIG. 11, an injection-molded article, for example, the rear plate 380 of FIG. 4 may further include a second plating layer 611 disposed toward the inner space of the electronic device. The second plating layer 611 may be formed of metal (e.g., copper) having thermal conductivity, for example, may be formed on the inner surface of the rear plate 380 by the producing method described with reference to FIGS. 7 to 10, and, in an embodiment, may be additionally formed on the outer surface (e.g., the surface facing the –Z-axis direction in FIG. 11) of the rear plate 380. According to an embodiment, the second plating layer 611 may be disposed to at least partially face the printed circuit board (e.g., the printed circuit board 340 of FIG. 4), and may be disposed adjacent to an electronic element producing heat. In an embodiment, the second plating layer 611 may be additionally formed on a support member (e.g., the first support member 311 or the second support member 360 of FIG. 3). For example, the second plating layer 611 may be formed on another structure disposed adjacent to the printed circuit board 340, and may at least partially absorb heat produced by the electronic element or transfer the heat to another area around same.

According to various embodiments, the temperature at the highest temperature point of the electronic device has been measured to be approximately 38.65 degrees Celsius when the second plating layer 611 is not disposed, and approximately 38.35 degrees Celsius in a structure in which the second plating layer 611 is formed on the inner surface of the rear plate 380, and approximately 37.5 degrees Celsius in a structure in which the second plating layers 611 are formed on the inner and outer surfaces of the rear plate 380. For example, by forming the second plating layer 611 on the rear plate 380, heat produced inside the electronic device may be quickly dispersed or dissipated. This heat dissipation effect may be improved as the second plating layer 611 is additionally formed on the support member inside the electronic device, or the second plating layer 611 is formed over a larger area or is thicker. For example, in the rear plate 380, the second plating layer 611 may be formed wider and/or thicker, and thus the heat dissipation effect may be increased.

According to various embodiments, the second plating layer 611 may be substantially formed in a laser irradiation area (e.g., the area in which the primary irradiation areas A1 and the secondary irradiation areas A2 are combined in FIG. 8). In FIG. 8, the primary irradiation areas A1 and the secondary irradiation areas A2 are illustrated in a form in which the laser irradiation points P1 and P2 are arranged along one direction, but, by differentiating the arrangement of the irradiation points P1 and P2, the second plating layer 611 having a designated shape may be formed on the inner or outer surface of the rear plate 380 as shown in FIG. 11. In an embodiment, the area where the second plating layer 611 is formed or the shape of the second plating layer 611 may be designated wider from a position adjacent to the heat-producing electronic element to the periphery of the position, thereby dispersing or dissipating the heat produced from the electronic element over a wider area.

Figure 12:
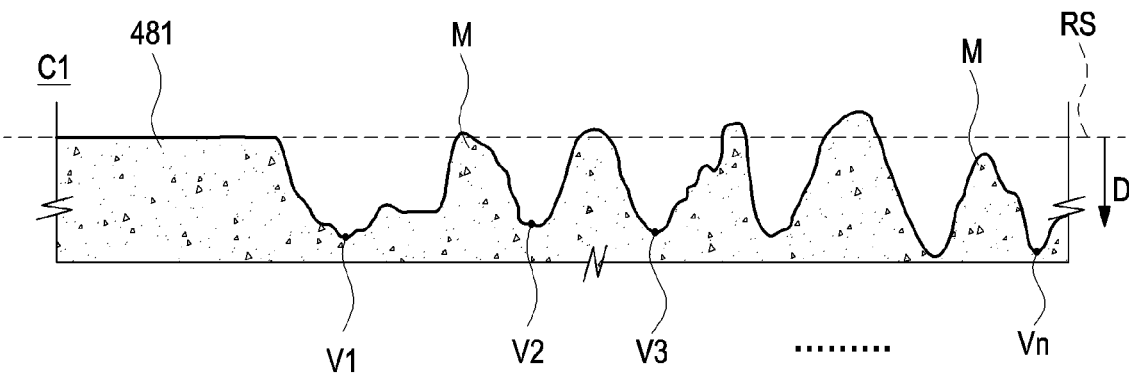
FIG. 12 is a cross-sectional view of the injection-molded article or the plate of the electronic device taken along line C1 of FIG. 11 according to various embodiments.
Figure 13:
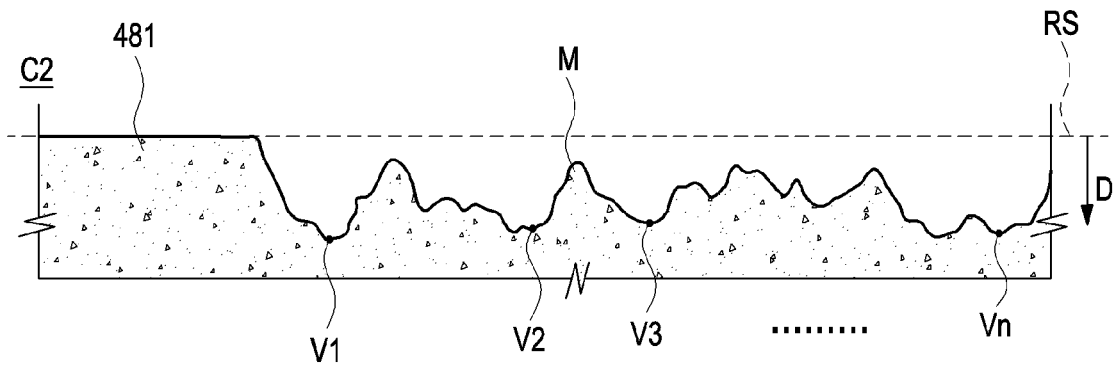
FIG. 13 is a cross-sectional view of the injection-molded article or the plate of the electronic device taken along line C2 of FIG. 11 according to various embodiments.
Figure 14:
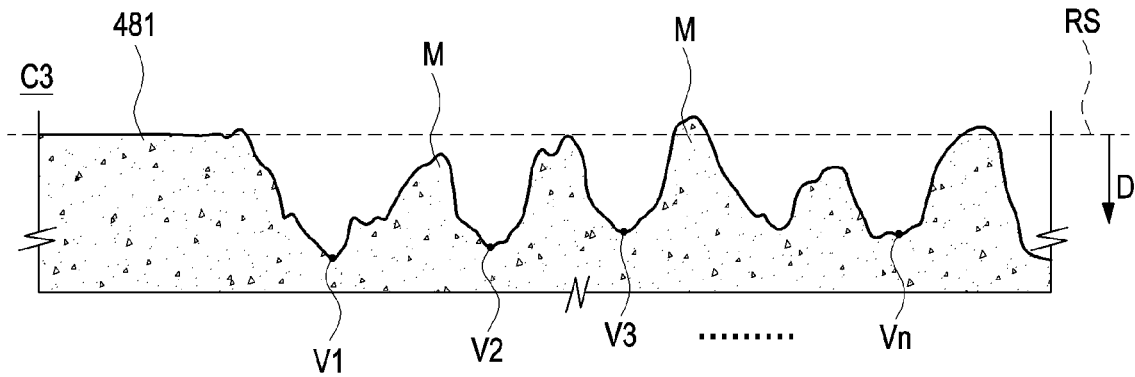
FIG. 14 is a cross-sectional view of the injection-molded article or the plate of the electronic device taken along line C3 of FIG. 11 according to various embodiments.
Figure 15:
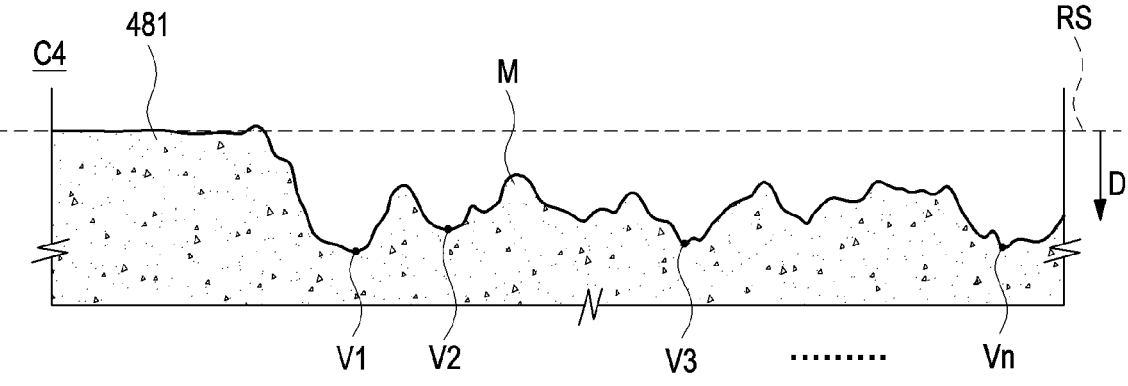
FIG. 15 is a cross-sectional view of the injection-molded article or the plate of the electronic device taken along line C4 of FIG. 11 according to various embodiments.

FIG. 12 is a cross-sectional view of the injection-molded article or the plate (e.g., the rear plate 380) of the electronic device taken along line C1 of FIG. 11 according to various embodiments. FIG. 13 is a cross-sectional view of the injection-molded article or the plate of the electronic device taken along line C2 of FIG. 11 according to various embodiments. FIG. 14 is a cross-sectional view of the injection-molded article or the plate of the electronic device taken along line C3 of FIG. 11 according to various embodiments. FIG. 15 is a cross-sectional view of the injection-molded article or the plate of the electronic device taken along line C4 of FIG. 11 according to various embodiments.

Referring to FIGS. 12 to 15, the areas where the laser has been irradiated (e.g., the irradiation areas A1 and A2 of FIG. 8) may form a recess (e.g., the processing groove 483 of FIG. 6) lower than a portion, to which the laser has not been irradiated, of the surface (e.g., the reference surface RS) of the polymer material portion 481 of FIG. 6 or the injection-molded article MP of FIGS. 8 to 10. According to an embodiment, a plurality of valleys V1, V2, V3, . . . Vn may be formed in the areas where the laser has been irradiated, and the positions indicated as the valleys V1, V2, V3, . . . Vn may generally correspond to points P1 and P2 in FIG. 8 or FIG. 9. Mountain-shaped portions M may be formed between the valleys V1, V2, V3, . . . Vn, but may be generally lower than the reference surface RS. In the illustrated embodiment, the maximum thickness of the plating layer or the conductive pattern 411 from the reference surface RS may be formed to be approximately 21.3 um or more and 27.4 um or less. "Maximum thickness of the plating layer or conductive pattern" may indicate the depth D of the valleys V1, V2, V3, . . . Vn, and the average depth of the valleys V1, V2, V3, . . . Vn may be approximately 23.36 um. Numerical values for the thickness of the plating layer or the conductive pattern 411 or the depth D of the valleys V1, V2, V3, . . . Vn mentioned in the embodiment are illustrated for the case in which the rear plate 380 has a thickness of several mm or less, and it should be noted that the disclosure is not limited thereto. For example, example numerical values may be variously changed in consideration of the thickness and mechanical rigidity of the rear plate 380.

According to various embodiments, some of the mountain-shaped portions M between the valleys V1, V2, V3, . .

. Vn may be higher than the reference surface RS. The heat dissipation performance using the second plating layer 611 may be slightly reduced depending on the height of the mountain-shaped portions M, but the heat dissipation performance of the second plating layer 611 formed on the inner or outer surface of the rear plate 380 may be substantially determined by the area where the second plating layer 611 is formed or the thermal conductivity of the second plating layer 611, and the effect of the thickness of the second plating layer 611 or the height of the mountain-shaped portions M on the heat dissipation performance may be insignificant. In an embodiment, the surface of the polymer material portion 481 or the injection-molded article MP altered by laser irradiation (e.g., the primary irradiation operation 502 of FIG. 7) may be easily scattered or removed during additional laser irradiation (e.g., the secondary irradiation operation 503 of FIG. 7) or the cleaning process, and thus, the mountain-shaped portions M between the valleys V1, V2, V3, . . . Vn may be substantially lower than the reference surface RS.

According to various example embodiments disclosed herein, a method (e.g., the production method 500 of FIG. 7) for producing an injection-molded article (e.g., the polymer material portion 481 of FIG. 6 or the injection-molded article MP of FIGS. 8 to 10) may include: molding an injection-molded article (e.g., the molding operation 501 of FIG. 7), irradiating a laser on areas spaced apart from each other (hereinafter, "primary irradiation areas") (e.g., the primary irradiation areas A1 of FIG. 8), on at least a part of the surface of the injection-molded article (hereinafter, "primary irradiation operation") (e.g., the primary irradiation operation 502 of FIG. 7), irradiating a laser on other areas spaced apart from each other (hereinafter, "secondary irradiation areas") (e.g., the secondary irradiation areas A2 of FIG. 8), on at least a part of the surface of the injection-molded article (hereinafter, "secondary irradiation operation") (e.g., the secondary irradiation operation 503 of FIG. 7), and forming a plating layer (e.g., the conductive pattern 411 of FIG. 6 or the second plating layer 611 of FIG. 11) on the primary irradiation areas and the secondary irradiation areas, on the surface of the injection-molded article, wherein each of the secondary irradiation areas at least partially overlap at least one of the primary irradiation areas.

According to various example embodiments, in the secondary irradiation operation, the laser may be irradiated to overlap any one of the primary irradiation areas in a range of 20% or more and 30% or less of the laser diameter.

According to various example embodiments, in the primary irradiation operation and the secondary irradiation operation, lasers having the same diameter may be irradiated.

According to various example embodiments, the laser may be irradiated such that the primary irradiation areas and the secondary irradiation areas are alternately arranged.

According to various example embodiments, the laser may be irradiated such that one of the secondary irradiation areas overlaps two adjacent primary irradiation areas.

According to various example embodiments, the secondary irradiation area may overlap one of the primary irradiation areas in a range of 20% or more and 30% or less of the laser diameter.

According to various example embodiments, the surface of the plating layer may be configured to form a continuous curved surface or a continuous flat surface with an area on the surface of the injection-molded article to which the laser has not been irradiated.

According to various example embodiments, the method as described above may further include forming a decoration layer (for example, the decoration layers 423 in FIG. 6) on at least a part of a surface of the injection-molded article and the surface of the plating layer on the surface where the plating layer is formed.

According to various example embodiments, the decoration layer may include at least one of a deposition layer, a plating layer, a printing layer, or a decoration layer.

According to various example embodiments, the method as described above may further include forming a primer layer (e.g., the primer layer 421 in FIG. 6) on at least a part of the surface of the injection-molded article and the surface of the plating layer on the surface where the plating layer is formed, and the decoration layer may be formed on the surface of the primer layer.

According to various example embodiments disclosed herein, an electronic device (e.g., the electronic device 101, 102, 104, 200, and 300 of FIGS. 1 to 4) may include an injection-molded article (e.g., the housing 210 or the rear plate 380 of FIGS. 2 to 6, or the injection-molded article MP of FIGS. 8 to 10) produced by the method as described above.

According to various example embodiments, an electronic device as described above may include a housing (e.g., the housing 210 of FIG. 2 and FIG. 3) at least partially including a polymer material (e.g., the polymer material portion 481 of FIG. 6) and a support (e.g., the support members 311 and 360 of FIG. 3) accommodated inside the housing and at least partially including a polymer material, wherein at least one polymer material portion of the housing and the support includes the injection-molded article.

According to various example embodiments, an electronic device as described above may further include a processing groove (e.g., the processing groove 483 of FIG. 6) formed to include the primary irradiation areas and the secondary irradiation areas, the processing groove being recessed on the surface of at least one polymer material portion of the housing and the support member, and a conductive pattern (electrically conductive pattern) (e.g., the conductive pattern 411 of FIG. 6) formed of a metal material filled in the processing groove, wherein the surface of the conductive pattern forms a continuous flat surface or a continuous curved surface with a surface of the polymer material portion.

According to various example embodiments, at least one of the housing and the support may further include, on the surface where the conductive pattern is formed, a primer layer (e.g., the primer layer 421 of FIG. 6) formed to cover at least the conductive pattern, and at least one decoration layer (e.g., the decoration layers 423 of FIG. 6) formed on a surface of the primer layer.

According to various example embodiments, the surface of the conductive pattern may be formed at least partially lower than the surface of the polymer material portion.

According to various example embodiments, on the surface of the housing, the conductive pattern may be disposed on a surface facing an external space.

According to various example embodiments, an electronic device as described above may further include a printed circuit board (e.g., the printed circuit board 340 of FIG. 4) disposed inside the housing and a processor or a communication module including communication circuitry (e.g., the processor 120 or the communication module 190 of FIG. 1) disposed on the printed circuit board, wherein the processor or the communication module is configured to perform wireless communication using the conductive pattern.

According to various example embodiments, on the surface of the housing, the conductive pattern may be disposed on a surface facing the external space.

According to various example embodiments, the conductive pattern may include a nickel (Ni) layer (e.g., the first plating layer 411*a* in FIG. 6) formed on the bottom surface of the processing groove, a copper (Cu) layer (e.g., the second plating layer 411*b* of FIG. 6) formed on the surface of the nickel layer, a silver (Ag) layer (e.g., the third plating layer 411*c* in FIG. 6) formed on the surface of the copper layer, and a second nickel layer (e.g., the fourth plating layer 411*d* of FIG. 6) formed on the surface of the silver layer.

According to various example embodiments, the conductive pattern may have a maximum thickness of 21.3 um or more and 27.4 um or less.

In the above detailed description of the disclosure, various example embodiments have been described, but it will be apparent to one skilled in the art that various modifications are possible without departing from the scope of the disclosure. For example, in describing various embodiments disclosed herein, a structure in which a conductive pattern is formed on a housing or a rear plate is illustrated, but, if the polymer material portion is included, the conductive pattern may also be formed on other structures not illustrated (e.g., the first support member 311 of FIG. 4), and an electronic device may utilize a conductive pattern formed on other structures as an electrical object (e.g., an antenna radiation conductor, an electromagnetic shielding member, and/or a ground conductor). In an embodiment, a conductive pattern may be formed on a surface facing the –Z axis direction on the outer surface of the housing (e.g., the polymer material portion 481 of the rear plate 380 in FIG. 6), but the conductive pattern may be formed on an inner surface (e.g., a surface facing the +Z-axis direction) of the housing or the rear plate 380. It will also be understood that any of the embodiment(s) described herein may be used in conjunction with any other embodiment(s) described herein.

What is claimed is:

1. A method for producing an injection-molded article, the method comprising:
   molding the injection-molded article;
   irradiating, in a primary irradiation operation, a laser on primary irradiation areas spaced apart from each other, on at least a part of the surface of the injection-molded article;
   irradiating, in a secondary irradiation operation, a laser on secondary irradiation areas spaced apart from each other, on at least a part of the surface of the injection-molded article; and
   forming a plating layer on the primary irradiation areas and the secondary irradiation areas, on the surface of the injection-molded article,
   wherein each of the secondary irradiation areas at least partially overlap at least one of the primary irradiation areas.

2. The method of claim 1, wherein, in the secondary irradiation operation, the laser is irradiated to overlap any one of the primary irradiation areas in a range of 20% or more and 30% or less of the laser diameter.

3. The method of claim 1, wherein the laser on the primary irradiation areas and the laser on the secondary irradiation areas are irradiated such that the primary irradiation areas and the secondary irradiation areas are alternately arranged.

4. The method of claim 3, wherein the laser on the secondary irradiation areas is irradiated such that one of the secondary irradiation areas overlaps two adjacent primary irradiation areas.

5. The method of claim 1, wherein the surface of the plating layer is configured to form a continuous curved surface or a continuous flat surface with an area on the surface of the injection-molded article to which the laser on the primary irradiation areas and the laser on the secondary irradiation areas have not been irradiated.

6. The method of claim 5, further comprising forming a decoration layer on at least a part of a surface of the injection-molded article and a surface of the plating layer on the surface where the plating layer is formed, the decoration layer comprising at least one of a deposition layer, a plating layer, a printing layer, or a paint layer.

7. An electronic device comprising an injection-molded article produced by the method according to claim 1.

8. The electronic device of claim 7, comprising:
   a housing at least partially comprising a polymer material; and
   a support accommodated inside the housing and at least partially comprising a polymer material,
   wherein at least one polymer material portion of the housing and the support comprises the injection-molded article.

9. The electronic device of claim 8, further comprising:
   a processing groove formed to include the primary irradiation areas and the secondary irradiation areas, the processing groove being recessed on the surface of at least one polymer material portion of the housing and the support; and
   a conductive pattern formed of a metal material filled in the processing groove,
   wherein the surface of the conductive pattern forms a continuous flat surface or a continuous curved surface with a surface of the polymer material portion.

10. The electronic device of claim 9, wherein at least one of the housing and the support further comprises:
   on the surface where the conductive pattern is formed, a primer layer covering at least the conductive pattern; and
   at least one decoration layer disposed on a surface of the primer layer.

11. The electronic device of claim 9, wherein the surface of the conductive pattern is at least partially lower than the surface of the polymer material portion.

12. The electronic device of claim 9, wherein, on the surface of the housing, the conductive pattern is disposed on a surface facing an external space.

13. The electronic device of claim 9, further comprising:
   a printed circuit board disposed inside the housing; and
   a processor or a communication module comprising communication circuitry disposed on the printed circuit board,
   wherein the processor or the communication module is configured to perform wireless communication using the conductive pattern.

14. The electronic device of claim 9, wherein the conductive pattern comprises:
   a nickel (Ni) layer formed on the bottom surface of the processing groove;
   a copper (Cu) layer formed on the surface of the nickel layer;
   a silver (Ag) layer formed on the surface of the copper layer; and a second nickel layer formed on the surface of the silver layer.

15. The electronic device of claim 9, wherein the conductive pattern has a maximum thickness of 21.3 um or more and 27.4 um or less.

\*   \*   \*   \*   \*